United States Patent
Ong et al.

(10) Patent No.: US 6,855,951 B2
(45) Date of Patent: Feb. 15, 2005

(54) FLUORINATED POLYTHIOPHENES AND DEVICES THEREOF

(75) Inventors: Beng S. Ong, Mississauga (CA); Lu Jiang, Albuquerque, NM (US); Yiliang Wu, Mississauga (CA); Ping Liu, Mississauga (CA)

(73) Assignee: Xerox Corporation, Stamford, CT (US)

( * ) Notice: Subject to any disclaimer, the term of this patent is extended or adjusted under 35 U.S.C. 154(b) by 143 days.

(21) Appl. No.: 10/392,639

(22) Filed: Mar. 19, 2003

(65) Prior Publication Data

US 2004/0183068 A1 Sep. 23, 2004

(51) Int. Cl.$^7$ .................... H01L 35/24; H01L 29/763
(52) U.S. Cl. .......................... 257/40; 257/289
(58) Field of Search ................ 257/40, 66, 289

(56) References Cited

U.S. PATENT DOCUMENTS

| | | | |
|---|---|---|---|
| 5,347,144 A | * 9/1994 | Garnier et al. ............. | 257/40 |
| 5,619,357 A | 4/1997 | Angelopoulos et al. ..... | 349/110 |
| 5,777,070 A | 7/1998 | Inbasekaran et al. ....... | 528/394 |
| 5,969,376 A | 10/1999 | Bao ........................... | 257/40 |
| 6,107,117 A | 8/2000 | Bao et al. .................. | 438/99 |
| 6,150,191 A | 11/2000 | Bao ........................... | 438/99 |
| 6,278,127 B1 | * 8/2001 | Dodabalapur et al. ....... | 257/40 |
| 6,320,200 B1 | * 11/2001 | Reed et al. ................ | 257/40 |
| 6,608,323 B2 | * 8/2003 | Marks et al. ............... | 257/40 |
| 6,621,099 B2 | * 9/2003 | Ong et al. .................. | 257/40 |

OTHER PUBLICATIONS

Beng S. Ong et al., U.S. Appl. No. 10/042,357 on Polythiophenes and Devices Thereof, filed Jan. 11, 2002.

* cited by examiner

Primary Examiner—T. N. Quach
(74) Attorney, Agent, or Firm—E. O. Palazzo

(57) ABSTRACT

An electronic device containing a polythiophene

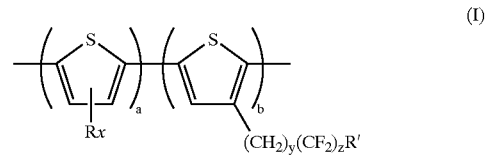

(I)

wherein R is an alkyl alkoxy; x represents the number of R groups; R' is $CF_3$, alkoxy, alkyl, or optionally alkylene; y and z represent the number of segments; and a and b represent the mole fractions of each moiety, respectively, wherein the sum of a+b is equal to about 1.

31 Claims, 2 Drawing Sheets

FLUORINATED POLYTHIOPHENES AND DEVICES THEREOF

COPENDING APPLICATIONS

In copending application U.S. Ser. No. 10/392,592, the disclosure of which is totally incorporated herein by reference, filed concurrently herewith on Polythiophene and Devices Thereof, there is illustrated a device containing a polythiophene prepared by a metal halide polymerization in an aromatic solvent, and which polythiophene is comprised of at least one monomer unit selected from the group consisting of a 2,5-thienylene segment (I), and a 2,5-thienylene segment (II)

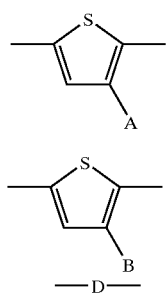

wherein A is alkyl, a halide, or alkoxy; B is a hydrogen atom, a halide, an alkyl or an alkoxy; and D is a divalent linkage for said (I) and (II).

In copending application U.S. Ser. No. 10/392,633, the disclosure of which is totally incorporated herein by reference, filed concurrently herewith, on Fluorinated Polythiophenes and Devices Thereof, the disclosure of which is totally incorporated herein by reference is a polythiophene comprising a repeating segment of the formula

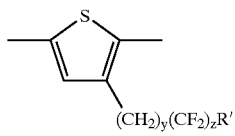

wherein R' is $CF_3$, alkyl or alkoxy; and y and z represent the number of repeating segments.

Illustrated in applications U.S. Ser. No. 10/042,342, U.S. Ser. No. 10,042,356, U.S. Pat. No. 6,621,099, U.S. Ser. No. 10/042,358, U.S. Pat. No. 6,770,904 U.S. Ser. No. 10/042,357, U.S. Ser. No. 10/042,359, U.S. Pat. No. 6,777,529, U.S. Ser. No. 10/042,360, the disclosures of which are totally incorporated herein by reference, all filed on Jan. 11, 2002 and all titled "Polythiophenes and Devices Thereof", are polythiophenes and devices thereof. More specifically, in a number of the aforementioned patent applications there are illustrated certain fluorinated polythiophenes, for example in U.S. Ser. No. 10/042,357, there are disclosed polythiophenes of the formula

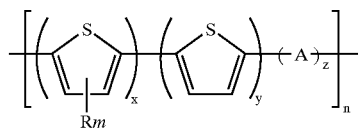

wherein R is a side chain; m is the number of substituents; A is a divalent linkage; x, y and z represent, respectively, the numbers of R substituted thienylene, unsubstituted thienylene, and divalent linkages A in the monomer segment with z being either 0 or 1; and n represents the number of the repeating monomer segments in the polymer chain or the degree of polymerization.

In copending application U.S. Ser. No. 10/042,359 there is illustrated polythiophenes of the formula

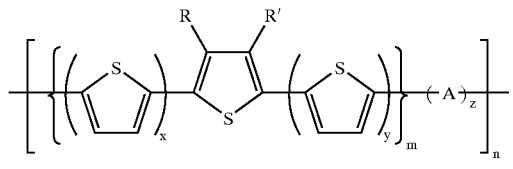

wherein R and R' are side chains; A is a divalent linkage; x and y represent the number of unsubstituted thienylene untis; z is 0 or 1, and wherein the sum of x and y is greater than zero; m represents the number of segments; and n represents the degree of polymerization.

In copending application U.S. Ser. No. 10/042,358, there is illustrated an electronic device containing a polythiophene

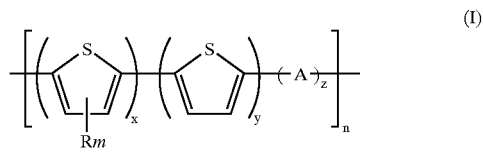

wherein R represents a side chain, m represents the number of R substituents; A is a divalent linkage; x, y and z represent, respectively, the number of $R_m$ substituted thienylenes, unsubstituted thienylenes, and divalent linkages A in the monomer segment subject to z being 0 or 1, and n represents the number of repeating monomer segments in the polymer or the degree of polymerization.

The appropriate components, processes thereof and uses thereof illustrated in the above copending applications may be selected for the present invention in embodiments thereof.

BACKGROUND

The present invention is generally directed to polythiophenes and uses thereof. More specifically, the present invention in embodiments is directed to electronic devices, such as thin film transistors (TFT), containing a novel class of polythiophenes, especially poly(perfluoroalkylthiophenes) wherein certain repeating thienylene units possess perfluoroalkyl and alkyl side chains, which are arranged in a regioregular manner on the polythiophene backbone, and which polythiophenes are, for example, useful as active semiconductor materials in thin film transistors. In embodiments the polythiophenes, which can be comprised of, for example, two monomers such as 3-alkylthiophene and 3-perfluoroalkylthiophene in various effective proportions, possess the ability to self-organize when coated from their solutions into molecularly ordered thin films. The self-organization is a result, it is believed, of the intermolecular interaction between the side chains.

The polythiophenes of the present invention are, for example, derived from perfluoroalkylthiophene and alkylthiophene or alkoxythiophenes, and more specifically, by copolymerization of two monomers, an alkylthiophene or alkoxythiophene, and a perfluoroalkylthiophene by a metal halide-mediated coupling reaction, or from an alkyl or alkoxy-2,5-dihalothiophene and a perfluoroalkyl-2,5-dihalaothiophene by regioregular copolymerization. These poly(perfluoroalkylthiophene)s generally possess excellent solution stability, and are suitable for solution fabrication processes.

Semiconductor polymers, such as certain polythiophenes, which are useful as active semiconductor materials in thin film transistors (TFTs), have been reported. A number of these polymers have some solubility in organic solvents and thus can be fabricated as semiconductor channel layers in TFTs by solution processes, such as spin coating, solution casting, dip coating, screen printing, stamp printing, jet printing and the like. Fabrication by common solution processes could render the manufacturing of TFTs by a noncomplex cost effective manner in comparison to the costly conventional photolithographic processes typical of silicon-based devices such as hydrogenated amorphous silicon. TFTs fabricated with polymer materials on flexible substrates, such as plastic films, provide structural flexibility and generally better mechanical properties, and which TFTs are useful for large area devices, such as large area image sensors, electronic paper and other display media where structural flexibility and mechanical robustness are of value. Also, the selection of polymer TFTs for integrated circuit logic elements for low-end microelectronics, such as smart cards, radio frequency identification (RFID) tags, and memory/storage devices, may also greatly enhance their mechanical durability, and thus their useful life span. Nonetheless, a number of the semiconductor polythiophenes may not be suitable for fabrication in ambient environments since they tend to be oxidatively doped by atmospheric oxygen, resulting in increased conductivity, thus in larger off-current and lower current on/off ratio for the devices fabricated from these materials. Accordingly, with many of these materials, rigorous precautions have to be undertaken during materials processing and device fabrication to exclude environmental oxygen to avoid or minimize oxidative doping. These precautionary measures add to the cost of manufacturing, therefore offsetting the appeal of certain polymer TFTs as an economical alternative to amorphous silicon technology, particularly for large area devices. These and other disadvantages are avoided or minimized in embodiments of the present invention.

REFERENCES

A number of organic semiconductor materials has been described for use in field-effect TFTs, which materials include organic small molecules, such as pentacene, see for example D. J. Gundlach et al., "Pentacene organic thin film transistors—molecular ordering and mobility", *IEEE Electron Device Lett.*, Vol. 18, p. 87 (1997), to oligomers, such as sexithiophenes or their variants, see for example reference F. Garnier et al., "Molecular engineering of organic semiconductors: Design of self-assembly properties in conjugated thiophene oligomers", *Amer. Chem. Soc.*, Vol. 115, p. 8716 (1993), certain polythiophenes, such as poly(3-alkylthiophene), see for example reference Z. Bao et al., "Soluble and processable regioregular poly(3-hexylthiophene) for field-effect thin film transistor application with high mobility", *Appl. Phys. Lett.* Vol. 69, p. 4108 (1996), and n-type fluorinated oligothiophenes, T. J. Marks, A. Facchetti, H. Sirringhaus, R. Friends, "*n-Type thiophene semiconductors*", International Publication Number: WO 02/09201 A1, International Application Number: PCT/US01/41408, applicants: Northwestern University and University of Cambridge, International publication date, 31 Jan. 2002. Although organic material based TFTs generally provide lower performance characteristics than their conventional silicon counterparts, such as silicon crystal or polysilicon TFTs, they are nonetheless sufficiently useful for applications in areas where high mobility is not required. These include large area devices, such as image sensors, active matrix liquid crystal displays and low-end microelectronics such as smart cards and RFID tags. TFTs fabricated from organic or polymer materials may be functionally and structurally more desirable than conventional silicon technology in the aforementioned areas in that they may offer mechanical durability, structural flexibility, and the potential of being able to be incorporated directly onto the active media of the devices, thus enhancing device compactness for mobility. However, most small molecule or oligomer-based devices rely on difficult vacuum deposition techniques for fabrication. Vacuum deposition is selected primarily because the small molecular materials are either insoluble or their solution processing by spin coating, solution casting, or stamp printing do not generally provide uniform thin films. In addition, vacuum deposition may also involve the difficulty of achieving consistent thin film quality for large area format. Most known polythiophenes, such as, for example, regioregular poly(3-alkylthiophene-2,5-diyl), are very sensitive to air. The TFTs fabricated from these materials in ambient conditions generally exhibit large off-current, low current on/off ratios, and their performance characteristics degrade rapidly. For practical low cost TFT design, it is therefore of value to arrive at a semiconductor material that is both air stable and solution processable, and where its performance is not substantially adversely affected by ambient oxygen.

Further, references that may be of interest include U.S. Pat. Nos. 6,150,191; 6,107,117; 5,969,376; 5,619,357, and 5,777,070.

FIGURES

Illustrated in FIGS. 1 to 4 are various representative embodiments of the present invention, and wherein polythiophenes are selected as the channel materials in thin film transistor (TFT) configurations.

SUMMARY AND EMBODIMENTS

It is a feature of the present invention to provide semiconductor polymers, such as poly(perfluoroalkylthiophene), which are useful for microelectronic applications, such as TFT devices.

It is another feature of the present invention to provide certain poly(perfluoroalklylthiophene)s which are useful as microelectronic components, and which polythiophenes have reasonable solubility of, for example, at least about 0.1 percent by weight in common organic solvents, such as methylene chloride, tetrahydrofuran, toluene, xylene, mesitylene, chlorobenzene, and the like, and thus these components can be economically fabricated by solution processes such as spin coating, screen printing, stamp printing, dip coating, solution casting, jet printing, and the like.

Another feature of the present invention resides in providing microelectronic device components, such as TFTs with a poly(perfluoroalkylthiophene)s channel layer, and which layer has a conductivity of from about $10^{-5}$ to about $10^{-10}$ S/cm (Siemens/centimeter).

Also, in yet another feature of the present invention there are provided poly(perfluoroalkylthiophene)s, and which polythiophenes are suitable for fabricating electronic device components under ambient conditions, thus enabling lower manufacturing cost.

Additionally, in a further feature of the present invention there is provided a class of poly(perfluoroalkylthiophene)s with unique structural features which are conducive to molecular self-alignment under appropriate processing conditions, and which structural features also enhance the stability of device performance.

Aspects of the present invention include a polythiophene of Formula (I)

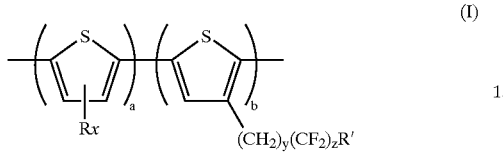

(I)

wherein R is a suitable substituent, such as for example, alkyl or alkoxy; x represents the number of repeating groups; R' is $CF_3$, alkoxy or alkyl; y and z represent the number of perfluoroalkyl segments; and a and b represent the mole fractions of each moiety, and wherein the sum of a+b is equal to about 1; a process for the preparation of perfluoroalkyl-substituted polythiophenes comprising reacting about 1 molar equivalent of at least one 2,5-dibromothiophene monomer with about 1 molar equivalent of an alkyl magnesium halide at a temperature of from about 40° C. to about 85° C., followed by the addition of a catalytic amount of [1,2-bis(diphenyl phosphinoethane)] dichloronickel (II); a process for the preparation of perfluoroalkyl-substituted polythiophenes comprising reacting 2,5-dibromothiophene monomers with Rieke Zn in an anhydrous solvent of tetrahydrofuran, followed by the addition of a catalytic amount of [1,2-bis(diphenyl phosphinoethane)]dichloronickel (II) and heating at a temperature of about 30° C. to about 80° C.; a polythiophene of the formulas wherein a and b represent the mole fractions of each moiety

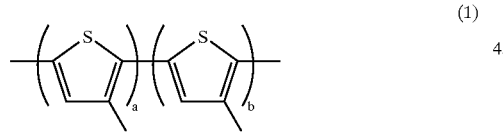

(1)

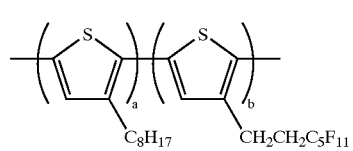

(2)

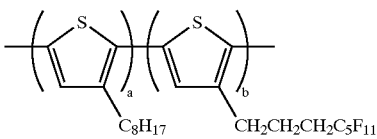

(3)

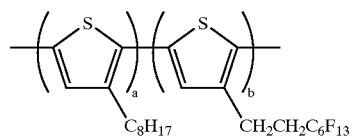

(4)

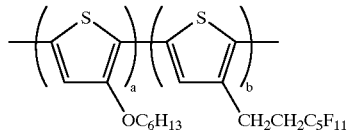

(5)

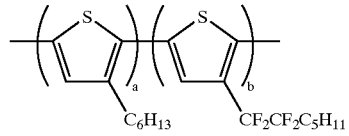

(6)

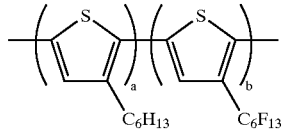

(7)

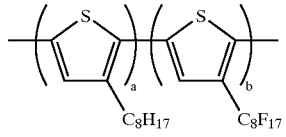

(8)

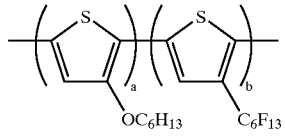

(9)

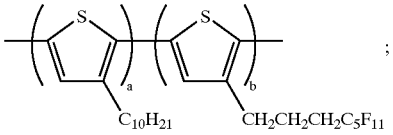

(10)

;

a polythiophene process comprising reacting a bromothiophene with a metal halide in the presence of a catalyst; an electronic device comprised of a polythiophene

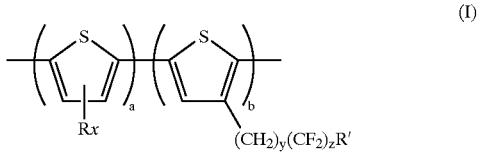

(I)

wherein R is a suitable substituent, such as an alkyl or alkoxy; x represents the number, such as 1 to about 3, of R groups; R' is $CF_3$, alkoxy or alkyl; y and z represent the number of segments; and a and b are the mole fractions of each moiety, respectively, wherein the sum of a+b is equal to about 1; an electronic device wherein R is alkyl with from about 6 to about 15 carbon atoms; R' is $CF_3$; y is 0 to about 3, and z is from about 1 to about 5; an electronic device wherein R is selected from the group consisting of pentyl, pentyloxy, hexyl, hexyloxy, heptyl, heptyloxy, octyl, octyloxy, nonyl, nonyloxy, decyl, decyloxy undecyl, undecyloxy, dodecyl, and dodecyloxy; an electronic device wherein x is 2, and two of the R substituents form an integral cyclic structure with the thiophene moiety; an electronic device containing a polythiophene of the formulas illustrated herein and wherein R' is $CF_3$; y is from about 1 to about 3, and z is from about 1 to about 5; an electronic device wherein a is from 0 to about 0.95, and b is from about 0.05 to about 1; an electronic device wherein the number average molecular weight ($M_n$) of the polythiophene is from about 2,000 to about 100,000, and the weight average molecular weight ($M_w$) is from about 4,000 to about 500,000, each measured by gel permeation chromatography using polystyrene standards; a thin film transistor comprised of a substrate, a gate electrode, a gate dielectric layer, a source electrode and a drain electrode, and in contact with the source/drain electrodes and the gate dielectric layer a layer comprised of a polythiophene (I)

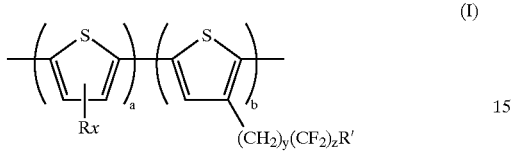

(I)

wherein R is a suitable substituent, such as an alkyl or alkoxy; x represents the number, such as 1 to about 3, of R groups; R' is $CF_3$, alkoxy, or alkyl; y and z represent the number of repeating segments; and a and b represent the mole fractions of each segment; a thin film transistor wherein the polythiophene (I) possesses a number average molecular weight ($M_n$) of from about 2,000 to about 100,000; and a weight average molecular weight ($M_w$) of from about 4,000 to over 500,000, both $M_w$ and $M_n$ being measured by gel permeation chromatography using polystyrene standards; a thin film transistor wherein R is alkyl or alkoxy selected from the group consisting of methyl methoxy, ethyl, ethoxy, propyl, propoxy, butyl, butoxy, pentyl, pentyloxy, hexyl, hexyloxy, heptyl, heptyloxy, octyl, octyloxy, nonyl, nonyloxy, decyl, decyloxy undecyl, undecyloxy, dodecyl, dodecyloxy, and isomeric forms thereof; a thin film transistor wherein the polythiophene x is 2, and the two R substituents form an integral cyclic structure with the thiophene moiety; a thin film transistor wherein R' is selected from the group consisting of methyl, ethyl, propyl, butyl, pentyl, hexyl, heptyl, octyl, nonyl, decyl, undecyl, dodecyl, and isomeric forms thereof; a thin film transistor wherein R' is alkyl; a thin film transistor wherein the polythiophene R is alkyl with from about 6 to about 15 carbon atoms; R' is $CF_3$; y is 0 to about 3, and z is from about 1 to about 5; a thin film transistor wherein R' is $CF_3$; y is from about 1 to about 3, and z is from about 1 to about 5; a thin film transistor wherein a is from 0 to about 0.95, and b is from about 0.05 to about 1; a thin film transistor wherein the substrate is a polyester, a polycarbonate, or a polyimide; the gate source and drain electrodes are each independently comprised of gold, nickel, aluminum, platinum, indium titanium oxide, or a conductive polymer, and the gate dielectric layer is comprised of silicon nitride or silicon oxide; a thin film transistor wherein the substrate is a polyester, a polycarbonate, or a polyimide, and the gate, source and drain electrodes are fabricated from the organic conductive polymer polystyrene sulfonate-doped poly(3,4-ethylene dioxythiophene) or from a conductive ink/paste compound of a colloidal dispersion of silver in a polymer binder, and the gate dielectric layer is organic polymer or inorganic oxide particle-polymer composite; a thin film transistor containing a polythiophene of the following alternative formulas or encompassed by the formulas, and wherein a and b represent the mole fractions of each moiety, and wherein a is, for example, from about 0.5 to about 0.75, respectively,

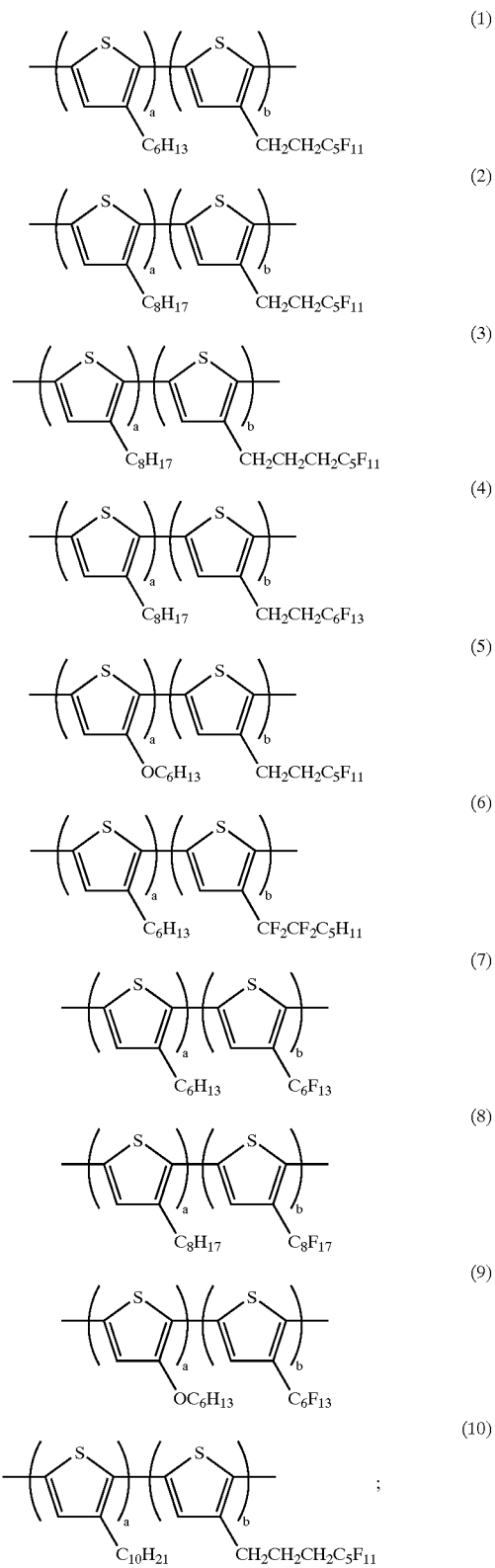

a thin film transistor and of the formulas, and wherein a and b represent the mole fractions of each moiety, respectively, and wherein the sum of a+b is equal to about 1

(1)
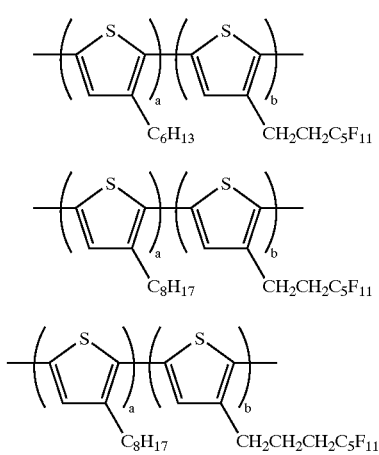

(2)

(3)
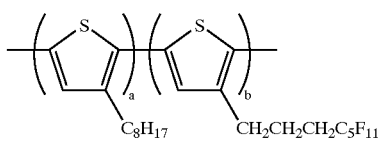

a thin film transistor and of the following formulas, and wherein a and b represent the mole fractions of each moiety, respectively, and wherein the sum of a+b is equal to about 1

(4)

(5)

(6)

(7)
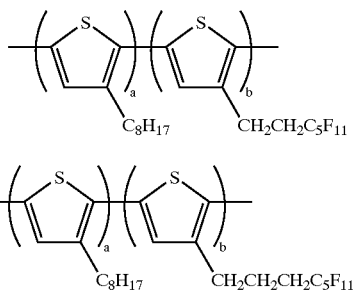

an electronic wherein R' is alkyl with from about 1 to about 15 carbon atoms; an electronic device wherein the polythiophene is of the alternative formulas (1)
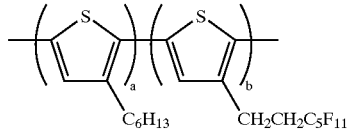

(2)
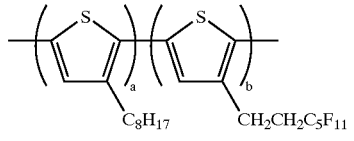

-continued (3)
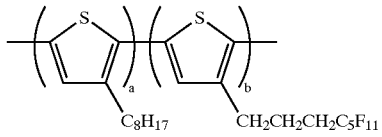

(4)
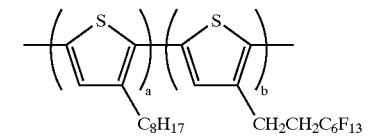

(5)
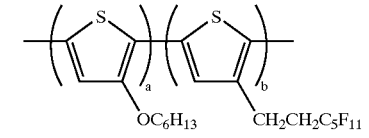

(6)
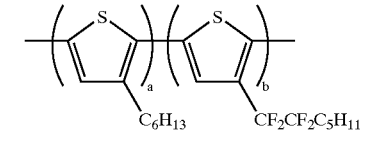

(7)
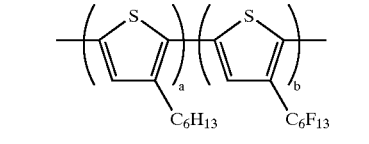

(8)
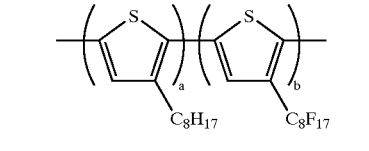

(9)
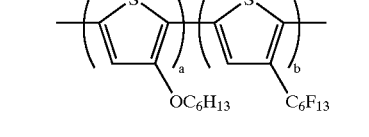

(10)
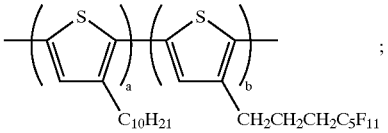

an electronic device comprised of a substrate, a gate electrode, a source electrode, and a polythiophene (I)
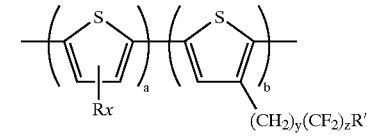

wherein R is an alkyl; X is the number of R groups; R' is $CF_3$; y and z represent the number of segments, or units throughout; and a and b represent the mole fractions of each moiety; an electronic device comprised of a substrate, a gate electrode, a source electrode, and a polythiophene

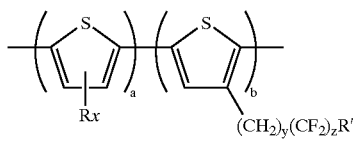

wherein R is alkoxy; x represents the number of R groups; R' is CF$_3$, alkoxy or alkyl; y and z represent the number of segments; and a and b represent the mole fractions of each moiety, respectively; an electronic device wherein R is alkoxy; an electronic device wherein x is 1, or wherein x is 2; an electronic device wherein R' alkyl is an alkylene; an electronic device wherein R' is alkoxy; an electronic device wherein R' is CF$_3$; an electronic device wherein x is 1; an electronic device wherein a is from about 0.05 to about 1; an electronic device wherein a is from about 0.25 to about 0.75; an electronic device wherein b is from about 0.25 to about 0.75; an electronic device wherein for the polythiophene the sum of a+b is equal to about 1; an electronic device wherein a is from about 0.05 to about 1; an electronic device wherein a is from about 0.5 to about 0.75, and optionally wherein b is from about 0.95 to about 0.25; an electronic device wherein a is from about 0.5 to about 0.75; an electronic device wherein a is from about 0.25 to about 0.75; an electronic device wherein b is from about 0.25 to about 0.75; an electronic device wherein R is alkyl, and R' is alkyl; an electronic device wherein R is alkoxy and R' is alkoxy; a thin film transistor comprised of

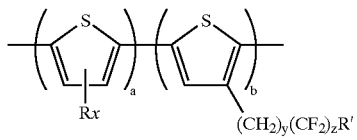

wherein R is alkyl or alkoxy; x is 1 or 2; R' is CF$_3$, alkyl or alkoxy; y and z represent the number of segments; a is from about 0.25 to about 0.75, and y is from about 0.75 to about 0.25; polythiophenes

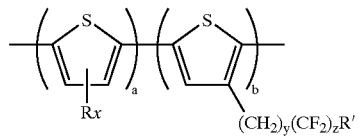

wherein R is an alkyl or alkoxy with about 1 to about 25 carbon atoms, x is 1 or 2; R' is CF$_3$ or alkyl with about 1 to about 12 carbon atoms; a and b are the mole fractions of the 3-substituted- or 3,4-disubstituted-2,5-thienylene moiety and 3-perfluoroalkyl-2,5-thienylene moiety, respectively, such that a+b is equal to 1, and y and z are, respectively, the numbers of CH$_2$ and CF$_2$ of the perfluoroalkyl chain; polythiophenes wherein a is from 0 to about 0.95 and b is from about 0.05 to about 1, providing that a+b is equal to 1, x is 1 or 2, y is from 0 to 5, and z is from 1 to 10; polythiophenes wherein R is methyl, methoxy, ethyl, ethoxy, propyl, propoxy, butyl, butoxy, pentyl, pentyloxy, hexyl, hexyloxy, heptyl, heptyloxy, octyl, octyloxy, nonyl, nonyloxy, decyl, decyloxy undecyl, undecyloxy, dodecyl, dodecyloxy, and isomeric forms thereof; polythiophenes wherein R' is CF$_3$, methyl, ethyl, propyl, butyl, pentyl, hexyl, heptyl, octyl, nonyl, decyl, undecyl, dodecyl, or the like; polythiophenes wherein the number average molecular weight (M$_n$) of the polythiophenes is from about 2,500 to about 100,000, and the weight average molecular weight (M$_w$) is from about 4,500 to about 500,000, both as measured by gel permeation chromatography using polystyrene standards; a process for the preparation of polythiophene (I) which involves the reaction of 1 molar equivalent of a mixture of dibromothiophene monomers (I) and (III) illustrated hereinafter with about 1 to about 1.05 molar equivalent of alkyl magnesium halide, followed by treatment with a catalytic amount of [1,2-bis(diphenyl phosphinoethane)] dichloronickel (II); a process for the preparation of polythiophene (I), which involves the reaction of a mixture of dibromothiophene monomers (I) and (III) with a 1.1 molar equivalent of Rieke Zn in anhydrous tetrahydrofuran, followed by the addition of catalytic amount of [1,2-bis (diphenyl phosphinoethane)]dichloronickel (II), and subsequent reaction by heating at a temperature of about 30° C. to about 80° C.; polythiophenes illustrated by or encompassed by Formula (I)

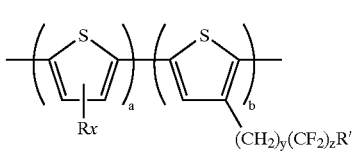

wherein R is alkyl with from about 1 to about 20 carbon atoms, and x is 1 or 2; R' is CF$_3$ or alkyl with from about 1 to about 15 carbon atoms; a and b represent the mole fractions of 3-substituted- or 3,4-disubstituted-2,5-thienylene moieties and 3-perfluoroalkyl-2,5-thienylene moiety, respectively; and y and z are, respectively, the numbers of CH$_2$ and CF$_2$ of the perfluoroalkyl chain with y being from 0 to 5, and z being from about 1 to about 10; polythiophenes with a number average molecular weight (M$_n$) of, for example, from about 2,000 to about 100,000, and more specifically, from about 4,000 to about 50,000, and a weight average molecular weight (M$_w$) of from about 4,000 to about 500,000, and more specifically, from about 5,000 to about 100,000, both as measured by gel permeation chromatography using polystyrene standards.

Illustrative examples of R include methyl, methoxy, ethyl, ethoxy, propyl, propoxy, butyl, butoxy, pentyl, pentyloxy, hexyl, hexyloxy, heptyl, heptyloxy, octyl, octyloxy, nonyl, nonyloxy, decyl, decyloxy undecyl, undecyloxy, dodecyl, dodecyloxy, isomeric forms thereof, and the like. Illustrative examples of R' include CF$_3$, methyl, ethyl, propyl, butyl, pentyl, hexyl, heptyl, octyl, nonyl, decyl, undecyl, dodecyl, isomeric forms thereof, and the like; and a and b are mole fractions with a, for example, being equal to from 0 to about 0.95 and b being equal to from about 0.05 to about 1 with the provision that a+b=1; x is 1 or 2, and y and z are numbers selected independently from 0 to about 10.

Specific illustrative polythiophene examples are as disclosed herein, wherein in embodiments a and b are mole fractions with a being equal to 0 to about 0.95 and b being equal to from about 0.05 to about 1 with the provision that a+b=1

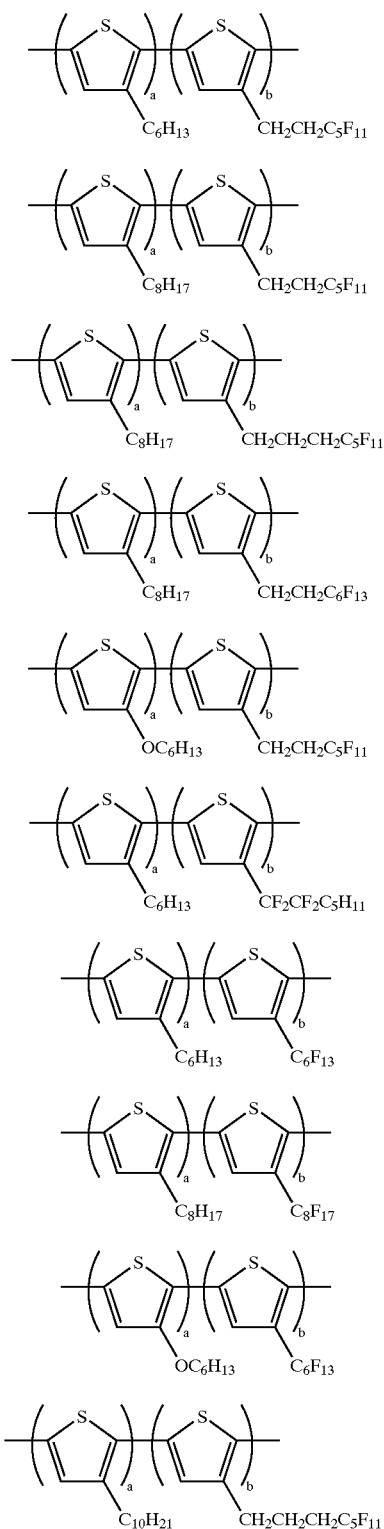

(1)
(2)
(3)
(4)
(5)
(6)
(7)
(8)
(9)
(10)

In embodiments the polythiophenes illustrated herein are soluble in common coating solvents, for example, in embodiments the polythiophenes possess a solubility of at least about 0.1 percent by weight, and more specifically, from about 0.5 percent to about 5 percent by weight in such solvents as methylene chloride, 1,2-dichloroethane, tetrahydrofuran, toluene, xylene, mesitylene, chlorobenzene, and the like. Moreover, the polythiophenes of the present invention in embodiments, when fabricated as semiconductor channel layers in TFT devices, provide a stable conductivity of, for example, from about $10^{-9}$ S/cm to about $10^{-6}$ S/cm, and more specifically, from about $10^{-8}$ S/cm to about $10^{-7}$ S/cm as determined by conventional four-probe conductivity measurements. Further, the polythiophenes possess side chains that are regioregularly positioned on the polythiophene backbone. These strategically positioned side chains of (I) facilitate proper alignment of side chains, enabling formation of higher-order microstructure domains in thin films. It is believed that these polythiophenes, when fabricated from solutions as thin films of, for example, about 10 nanometers to about 500 nanometers, form closely stacked lamella structures that are conducive to efficient charge carrier transport. The polythiophenes of the present invention in embodiments can enable formation of semiconductor layers using common deposition techniques, such as solution coating or jet printing in ambient conditions without costly precautionary measures in excluding ambient oxygen during device fabrication. Fabrication in ambient conditions is critical to low cost manufacturing.

The polythiophenes of the present invention can be prepared by a number of synthetic procedures as illustrated herein; and, for example, regioregular polythiophene (Ia) can be readily prepared by a regioregular head-to-tail Grignard Metathesis of 3-alkyl-2,5-dibromothiophene (II) and 3-perfluoroalkyl-2,5-dibromothiophene (III) according to Scheme 1.

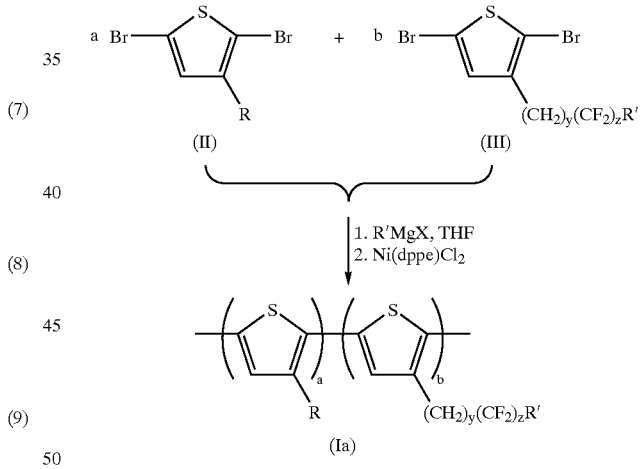

Scheme 1 where R, R', a, b, y and z are as illustrated herein, X is halide and Ni(dppe)Cl$_2$ is [1,2-bis(diphenylphosphinoethane)] dichloronickel (II).

The polymerization is generally conducted by slowly adding 1.02 molar equivalent of a 2M solution of an alkyl magnesium halide in ethyl ether to a well stirred solution of a 1 molar equivalent of a mixture of 3-R-2,5-dibromothiophene (II) and 3-perfluoroalkyl-2,5-dibromothiophene (III) in anhydrous tetrahydrofuran (THF) under an inert atmosphere. The resultant mixture is then stirred at about 65° C. for about 1 to about 5 hours, and then cooled down to room temperature, about 22° C. to about 25° C., at which time about 0.05 to about 0.15 of a molar equivalent of [1,2-bis(diphenyl phosphinoethane)] dichloronickel (II), Ni(dppe)Cl$_2$, in anhydrous THF is added. Subsequently, the stirring is continued at room temperature for about 1 to about 24 hours. After the polymerization, the mixture can be poured into methanol to precipitate the polythiophene product. The crude polythiophene, which can be purified via soxhlet extractions with suitable solvents, such as methnal, hexane and then chlorobenzene, is then recovered from the chlorobenzene fraction by precipitation from methanol, and dried in vacuo overnight, about 18 to about 22 hours. The yield of product generally is from about 30 to about 85 percent.

Figure 1:
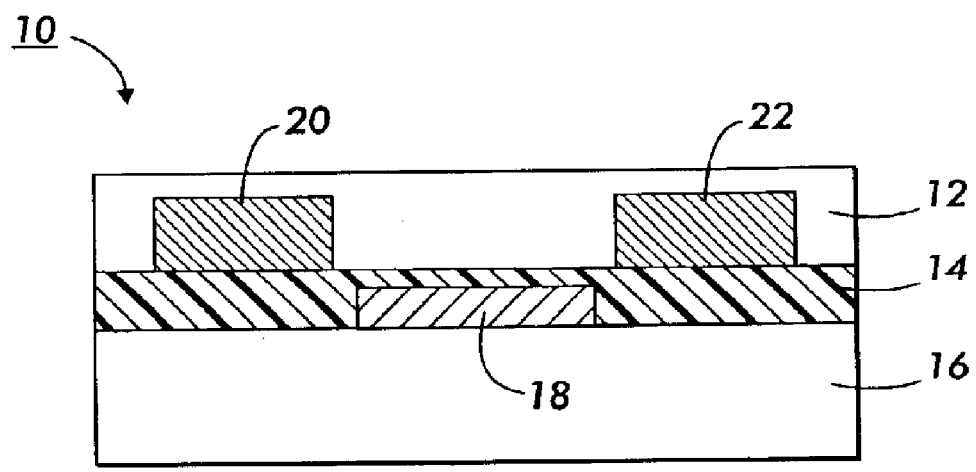
In FIG. 1 there is schematically illustrated a TFT configuration 10 comprised of a substrate 16, in contact therewith a metal contact 18 (gate electrode), and a layer of an insulating dielectric layer 14 with the gate electrode having a portion thereof or the entire gate in contact with the dielectric layer 14 and on top of layer 14 two metal contacts, 20 and 22 (source and drain electrodes) are deposited. Over and between the metal contacts 20 and 22 is the semiconductor layer 12 comprised of a polythiophene illustrated herein, and more specifically, polythiophene (I). The gate electrode can be included in the substrate, in the dielectric layer, and the like throughout.
Figure 2:
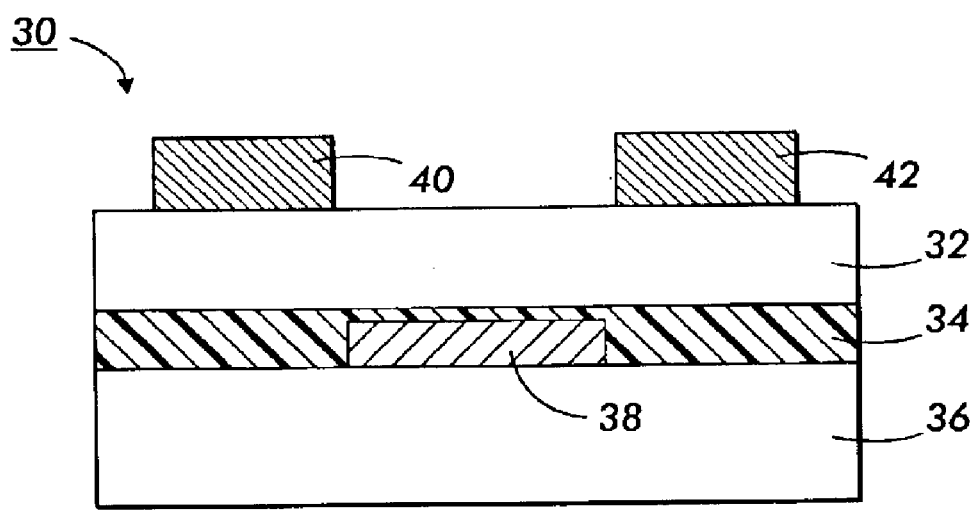
FIG. 2 schematically illustrates another TFT configuration 30 comprised of a substrate 36, a gate electrode 38, a source electrode 40, and a drain electrode 42, an insulating dielectric layer 34, and the polythiophene semiconductor layer 32.

In some embodiments of the present invention, an optional protecting layer may be incorporated on top of each of the transistor configurations of FIGS. 1, 2, 3 and 4. For the TFT configuration of FIG. 4, the insulating dielectric layer 74 may also function as a protecting layer.

In embodiments and with further reference to the present invention and the Figures, the substrate layer may generally be a silicon material inclusive of various appropriate forms of silicon, a glass plate, a plastic film or a sheet, and the like depending on the intended applications. For structurally flexible devices, a plastic substrate, such as for example polyester, polycarbonate, polyimide sheets, and the like, may be selected. The thickness of the substrate may be, for example, from about 10 micrometers to over 10 millimeters with a specific thickness being from about 50 to about 100 micrometers, especially for a flexible plastic substrate, and from about 1 to about 10 millimeters for a rigid substrate such as glass or silicon.

The insulating dielectric layer, which can separate the gate electrode from the source and drain electrodes, and which layer is in contact with the semiconductor layer, can generally be an inorganic material film, an organic polymer film, or an organic-inorganic composite film. The thickness of the dielectric layer is, for example, from about 10 nanometers to about 1 micrometer with a more specific thickness being from about 100 nanometers to about 500 nanometers. Illustrative examples of inorganic materials suitable as the dielectric layer include silicon oxide, silicon nitride, aluminum oxide, barium titanate, barium zirconate titanate, and the like; illustrative examples of organic polymers for the dielectric layer include polyesters, polycarbonates, poly(vinyl phenol), polyimides, polystyrene, poly(methacrylate)s, poly(acrylate)s, epoxy resin, and the like; and illustrative examples of inorganic-organic composite materials include metal oxide particles, especially nanosized particles, dispersed in polymers such as polyester, polyimide, epoxy resin and the like. The insulating dielectric layer is generally of a thickness of from about 50 nanometers to about 500 nanometers depending on the dielectric constant of the dielectric material used, and the dielectric material has a dielectric constant of, for example, at least about 3, thus a suitable dielectric thickness of about 300 nanometers can provide a desirable capacitance of, for example, about $10^{-9}$ to about $10^{-7}$ F/cm$^2$.

Situated, for example, between and in contact with the dielectric layer and the source/drain electrodes is the active semiconductor layer comprised of the poly (perfluoroalkylthiophene)s illustrated herein, and wherein the thickness of this layer is generally, for example, about 10 nanometers to about 1 micrometer, or about 40 to about 100 nanometers. This layer can generally be fabricated by solution processes such as spin coating, casting, screen, stamp, or jet printing of a solution of the polythiophenes of the present invention.

The gate electrode can be a thin metal film, a conducting polymer film, a conducting film generated from a conducting ink or paste, or the substrate itself (for example heavily doped silicon). Examples of gate electrode materials include but are not limited to aluminum, gold, chromium, indium tin oxide, conducting polymers, such as polystyrene sulfonate-doped poly(3,4-ethylenedioxythiophene) (PSS/PEDOT), a conducting ink/paste comprised of carbon black/graphite or colloidal silver dispersion contained in a polymer binder, such as ELECTRODAG® available from Acheson Colloids Company, silver filled electrically conductive thermoplastic ink available from Noelle Industries, and the like. The gate layer can be prepared by vacuum evaporation, sputtering of metals or conductive metal oxides, coating from conducting polymer solutions or conducting inks or dispersions by spin coating, casting or printing. The thickness of the gate electrode layer is, for example, from about 10 nanometers to about 10 micrometers with a specific thickness of, for example, from about 10 to about 200 nanometers for metal films and about 1 to about 10 micrometers for polymer conductors.

The source and drain electrode layer can be fabricated from materials which provide a low resistance ohmic contact to the semiconductor layer. Typical materials suitable for use as source and drain electrodes include gold, nickel, aluminum, platinum, conducting polymers, and conducting inks. Typical thickness of the source and gate layer is, for example, from about 40 nanometers to about 1 micrometer with a more specific thickness being from about 100 to about 400 nanometers. The TFT devices contain a semiconductor channel with a width W and length L. The semiconductor channel width may be, for example, from about 10 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is usually grounded and a bias voltage of generally, for example, about 0 volt to about −80 volts is applied to the drain electrode to collect the charge carriers transported across the semiconductor channel when a voltage of generally about +20 volts to about −80 volts is applied to the gate electrode.

Other known materials not recited herein for the various components of the TFT devices of the present invention can also be selected in embodiments.

The following Examples are provided.

GENERAL PROCEDURE a) Device Fabrication

Figure 3:
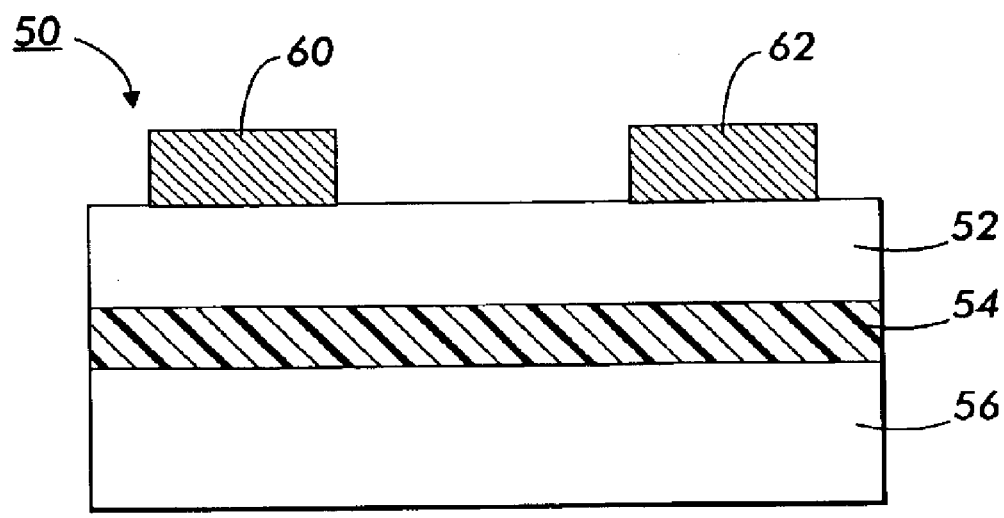
FIG. 3 schematically illustrates a further TFT configuration 50 comprised of a heavily n-doped silicon wafer 56, which can act as a gate electrode, a thermally grown silicon oxide dielectric layer 54, a polythiophene semiconductor layer 52, on top of which are deposited a source electrode 60 and a drain electrode 62.
Figure 4:
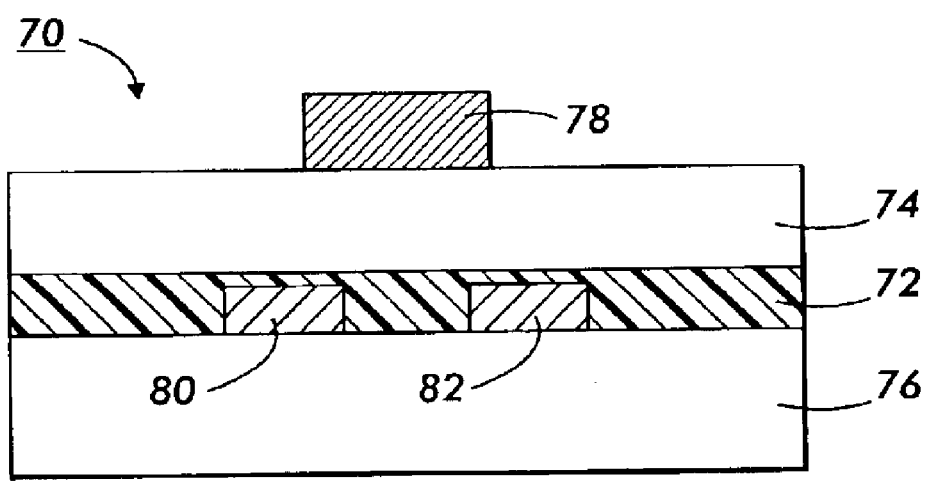
FIG. 4 schematically illustrates a TFT configuration 70 comprised of substrate 76, a gate electrode 78, a source electrode 80, a drain electrode 82, a polythiophene semiconductor layer 72, and an insulating dielectric layer 74.

There was selected a top-contact thin film transistor configuration as schematically illustrated, for example, in FIG. 3.

The device was comprised of an n-doped silicon wafer with a thermally grown silicon oxide layer of a thickness of about 110 nanometers thereon. The wafer functioned as the gate electrode while the silicon oxide layer acted as the gate dielectric and had a capacitance of about 32 nF/cm$^2$ (nanofarads/square centimeter). The fabrication of the device was accomplished at ambient conditions without any precautions to exclude the materials and device from exposure to ambient oxygen, moisture, or light. The silicon wafer was first cleaned with methanol, air dried, and then immersed in a 0.01 M solution of 1H,1H,2H,2H-perfluorooctyltrichlorosilane in toluene for 10 minutes at room temperature, about 23° C. to about 25° C. Subsequently, the wafer was washed with dichloromethane and dried. The semiconductor polythiophene layer of about 30 nanometers to about 100 nanometers in thickness was then deposited on top of the silicon oxide dielectric layer by spin coating at a speed of 1,000 rpm for about 35 seconds, and dried in vacuo at 80° C. for 20 hours. The solution used in fabricating the semiconductor layer, which was comprised of 1 percent by weight of the polythiophene in an appropriate solvent, was filtered through a 0.45 µm filter before use. Thereafter, the gold source and drain electrodes were deposited on top of the semiconductor polythiophene layer by vacuum deposition through a shadow mask with various channel lengths and widths, thus creating a series of transistors of various dimensions.

b) TFT Device Characterization

The evaluation of field-effect transistor performance was accomplished in a black box at ambient conditions using a Keithley 4200 SCS semiconductor characterization system. The carrier mobility, $\mu$, was calculated from the data in the saturated regime (gate voltage, $V_G$<source-drain voltage, $V_{SD}$) according to equation (1)

$$I_{SD}=C_i\mu(W/2L)(V_G-V_T)^2 \quad (1)$$

where $I_{SD}$ is the drain current at the saturated regime, W and L are, respectively, the semiconductor channel width and length, Ci is the capacitance per unit area of the gate dielectric layer, and $V_G$ and $V_T$ are, respectively, the gate voltage and threshold voltage. $V_T$ of the device was determined from the relationship between the square root of $I_{SD}$ at the saturated regime and $V_G$ of the device by extrapolating the measured data to $I_{SD}$=0.

Another property of field effect transistor is its current on/off ratio. This is the ratio of the saturation source-drain current when the gate voltage $V_G$ is equal to or greater than the drain voltage $V_D$ to the source-drain current when the gate voltage $V_G$ is zero.

EXAMPLE I

Preparation of Polythiophene (1, a=0.75; b=0.25)

i) Monomers 2,5-Dibromo-3-hexylthiophene was prepared by adding 35.60 (0.20 mol) of powdered N-bromosuccinimide to 16.83 grams (0.10 mol) of 3-hexylthiophene in 135 milliliters of 1:1 mixture of dichloromethane and acetic acid at room temperature over a period of 30 minutes. The mixture was then stirred for about 4 hours at room temperature and the progress of the reaction was monitored by TLC. After the reaction, the reaction mixture was diluted with 100 milliliters of dichloromethane and transferred to separatory funnel. The organic phase was separated and washed three times with water, two times with a 10 percent aqueous sodium bicarbonate solution, 2 times with a 5 percent aqueous sodium thiosulfate solution, and then three times with water again. The organic layer was separated and dried with magnesium sulfate, and the solvent removed by vacuum evaporation. Pure, about 99.5 percent, 2,5-dibromo-3-hexylthiophene was obtained by distillation under reduced pressure in a 86 percent yield.

$^1$H NMR (CDCl$_3$), δ: 0.90 (t, 3H), 1.30 (m, 6H), 2.51 (t, 2H), 6.78 (s, 1H).

Similarly, 2,5-dibromo-3-(4,4,5,5,6,6,7,7,7-nonafluoroheptyl)thiophene was prepared using the above procedure and the product was purified by column chromatography on silica gel.

$^1$H NMR (CDCl$_3$), δ: 2.23–1.80 (m, 4H), 2.68 (t, 2H), 6.81 (s, 1H).

ii) Polymerization

A 2M solution of octyl magnesium bromide in ethyl ether (1.40 milliliters, 2.80 mmol) was added slowly to a well-stirred solution of 3-hexylthiophene (0.670 gram, 2.06 mmol) and 3-(4,4,5,5,6,6,7,7,7-nonafluoroheptyl)thiophene (0.345 gram, 0.69 mmol) in 10 milliliters of anhydrous tetrahydrofuran (THF) in a 150 milliliter round-bottom flask under an inert argon atmosphere. The resultant mixture was stirred at 65° C. for 2.5 hours and then cooled down to room temperature, about 22° C. to about 25° C., at which time Ni(dppe)Cl$_2$ (0.014 gram, 0.0265 mmol) in 5 milliliters of anhydrous THF was added. The reaction mixture was subsequently stirred at room temperature for about 12 hours before pouring into well-stirred methanol to precipitate the polythiophene product. The precipitated crude polythiophene product was collected by filtration and then purified by successive soxhlet extractions with methanol, hexane and chlorobenzene. 1.05 Gram of pure polythiophene was isolated from the chlorobenzene fraction by precipitation from methanol followed by drying in vacuo overnight, about 18 to about 22 hours. The polythiophene was dark purple in color with an M$_w$ of 16,800 and an M$_n$ of 12,600 relative to polystyrene standards.

NMR spectroscopic analysis showed that the polythiophene had a head-to-tail regioregularity of over 94 percent.

$^1$H NMR (CDCl$_3$) δ: 0.90 (bs, 2.4H), 1.80–1.05 (m, 6.4H), 2.32–1.90 (m, 0.8H), 2.82 (t, 1.6H) for HT linkage (less than 6 percent intensity for H-H linkage in this α-position region at δ 2.58 was also observed), 2.94 (t, 0.4H), 6.97 (s, 1H), for HT-HT linkage.

TFT Device Fabrication and Characterization

Top-contact thin film transistor devices were fabricated with polythiophene (1) as prepared above in accordance with the procedure described herein by spin coating 1 weight percent solution of polythiophene (1) in chlorobenzene, followed by drying in vacuo at 80° C. (degrees Centigrade) for 20 hours. Subsequently, gold source and drain eletrodes were deposited by vacuum evaporation on top of the semiconductor layer through a shadow mask. No precautions were taken to exclude ambient oxygen, moisture or light during device fabrication. Using the transistors with dimensions of W=5,000 μm and L=60 μm, the following average properties from at least five separate transistors were observed.

| Mobility: | 1.3 to 1.8 × $10^{-2}$ $cm^2/V \cdot sec$ |
| --- | --- |
| On-off ratio: | 0.9 to 2.1 × $10^5$ |

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

What is claimed is:

1. An electronic device comprised of a polythiophene

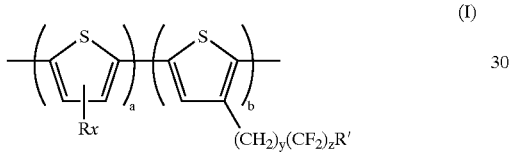

(I)

wherein R is an alkyl, alkoxy; x represents the number of R groups; R' is $CF_3$, alkoxy, alkyl, or optionally alkylene; y and z represent the number of segments; and a and b represent the mole fractions of each moiety, respectively, wherein the sum of a+b is equal to about 1.

2. An electronic device in accordance with claim 1 wherein R is alkyl with from about 6 to about 15 carbon atoms; R' is $CF_3$; y is 0 to about 3, and z is from about 1 to about 5.

3. An electronic device in accordance with claim 1 wherein R is selected from the group consisting of pentyl, pentyloxy, hexyl, hexyloxy, heptyl, heptyloxy, octyl, octyloxy, nonyl, nonyloxy, decyl, decyloxy undecyl, undecyloxy, dodecyl, and dodecyloxy.

4. An electronic device in accordance with claim 1 wherein x is 2, and two of said R substituents form an integral cyclic structure with said thiophene moiety.

5. An electronic device in accordance with claim 1 wherein R' is $CF_3$; y is from about 1 to about 3, and z is from about 1 to about 5.

6. An electronic device in accordance with claim 1 wherein a is from 0 to about 0.95, and b is from about 0.05 to about 1.

7. An electronic device in accordance with claim 1 wherein the number average molecular weight ($M_n$) of said polythiophene is from about 2,000 to about 100,000, and the weight average molecular weight ($M_w$) is from about 4,000 to about 500,000, each measured by gel permeation chromatography using polystyrene standards.

8. An electronic device in accordance with claim 1 wherein said polythiophene is of the alternative formulas

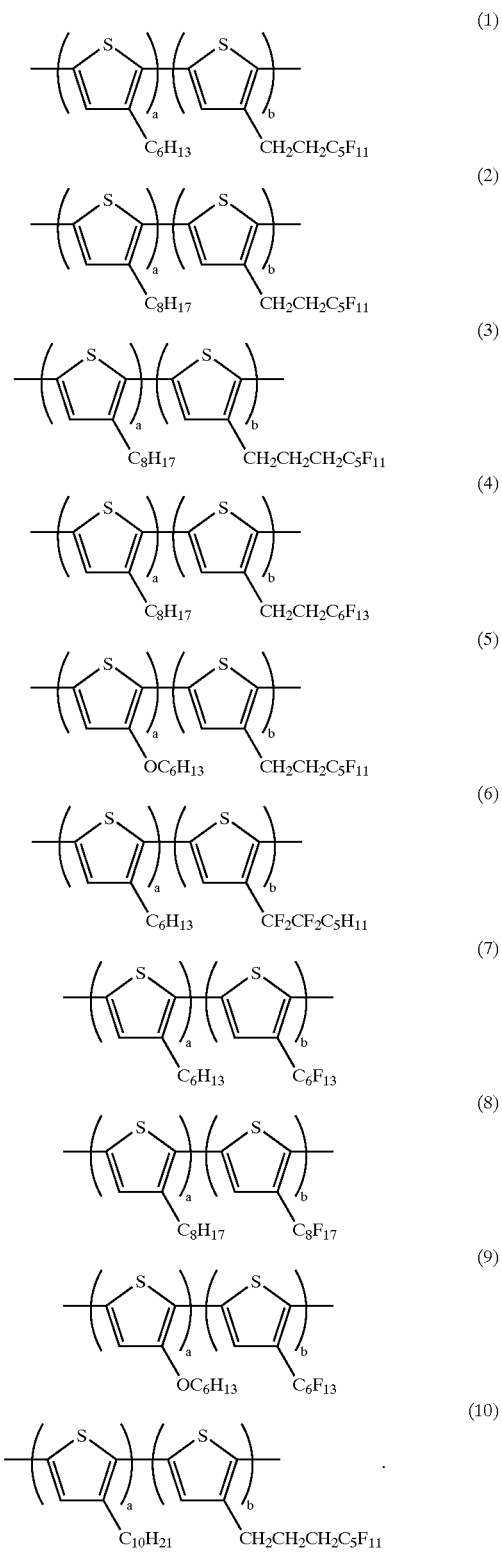

9. An electronic device in accordance with claim 1 wherein x is 1, or wherein x is 2.

10. An electronic device in accordance with claim 1 wherein R' is an alkylene.

11. An electronic device in accordance with claim 1 wherein a is from about 0.05 to about 1.

12. An electronic device in accordance with claim 1 wherein b is from about 0.25 to about 0.75.

13. A thin film transistor in accordance with claim 1 wherein x is 1 or 2; R' is $CF_3$; a is from about 0.25 to about 0.75, and y is from about 0.75 to about 0.25.

14. A thin film transistor comprised of a substrate, a gate electrode, a gate dielectric layer, a source electrode and a drain electrode, and in contact with the source/drain electrodes and the gate dielectric layer a layer comprised of a polythiophene (I)

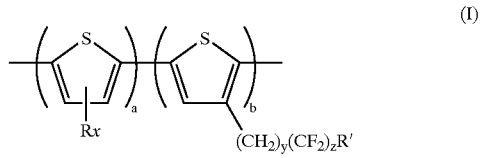

(I)

wherein R is an alkyl or alkoxy; x represents the number of R groups; R' is $CF_3$, alkoxy, or alkyl; y and z represent the number of repeating segments; and a and b represent the mole fractions of each segment.

15. A thin film transistor in accordance with claim 14 wherein said polythiophene (I) possesses a number average molecular weight ($M_n$) of from about 2,000 to about 100,000; and a weight average molecular weight ($M_w$) of from about 4,000 to over 500,000, both $M_w$ and $M_n$ being measured by gel permeation chromatography using polystyrene standards.

16. A thin film transistor in accordance with claim 14 wherein R is alkyl or alkoxy selected from the group consisting of methyl methoxy, ethyl, ethoxy, propyl, propoxy, butyl, butoxy, pentyl, pentyloxy, hexyl, hexyloxy, heptyl, heptyloxy, octyl, octyloxy, nonyl, nonyloxy, decyl, decyloxy undecyl, undecyloxy, dodecyl, dodecyloxy, and isomeric forms thereof.

17. A thin film transistor in accordance with claim 14 wherein R is alkyl or alkoxy selected from the group consisting of pentyloxy, hexyl, hexyloxy, heptyl, heptyloxy, octyl, octyloxy, nonyl, nonyloxy, decyl, decyloxy undecyl, undecyloxy, dodecyl, and dodecyloxy.

18. A thin film transistor in accordance with claim 14 wherein x is 2, and said two R substituents form an integral cyclic structure with the thiophene moiety.

19. A thin film transistor in accordance with claim 14 wherein R' is selected from the group consisting of methyl, ethyl, propyl, butyl, pentyl, hexyl, heptyl, octyl, nonyl, decyl, undecyl, dodecyl, and isomeric forms thereof.

20. A thin film transistor in accordance with claim 14 wherein R' is alkyl.

21. A thin film transistor in accordance with claim 14 wherein R is alkyl with from about 6 to about 15 carbon atoms; R' is $CF_3$; y is 0 to about 3, and z is from about 1 to about 5.

22. A thin film transistor in accordance with claim 14 wherein R' is $CF_3$; y is from about 1 to about 3, and z is from about 1 to about 5.

23. A thin film transistor in accordance with claim 14 wherein a is from 0 to about 0.95; b is from about 0.05 to about 1, and the sum of a plus b is equal to 1.

24. A thin film transistor in accordance with claim 14 wherein said substrate is a polyester, a polycarbonate, or a polyimide; said gate source and drain electrodes are each independently comprised of gold, nickel, aluminum, platinum, indium titanium oxide, or a conductive polymer, and said gate dielectric layer is comprised of silicon nitride or silicon oxide.

25. A thin film transistor in accordance with claim 14 wherein said substrate is a polyester, a polycarbonate, or a polyimide, and said gate, source and drain electrodes are fabricated from the organic conductive polymer polystyrene sulfonate-doped poly(3,4-ethylene dioxythiophene) or from a conductive ink/paste compound of a colloidal dispersion of silver in a polymer binder, and the gate dielectric layer is organic polymer or inorganic oxide particle-polymer composite.

26. A thin film transistor in accordance with claim 14 containing said polythiophene of the following alternative formulas or encompassed by said formulas, and wherein a and b represent the mole fractions of each moiety, respectively,

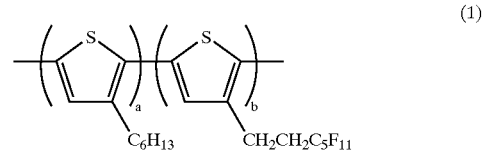

(1)

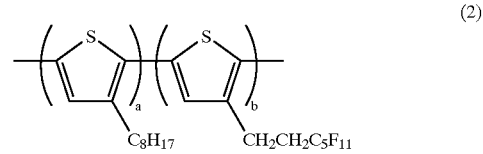

(2)

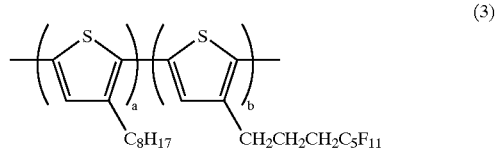

(3)

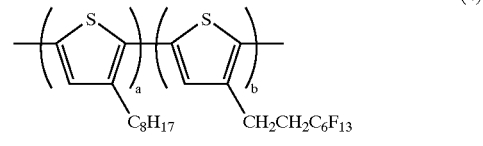

(4)

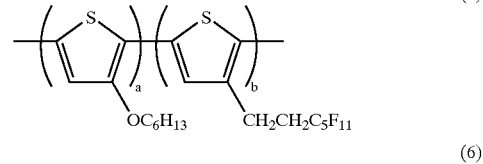

(5)

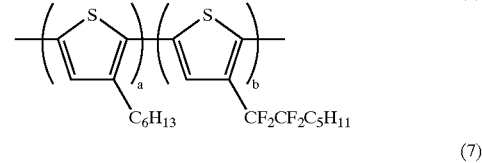

(6)

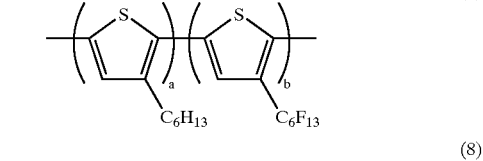

(7)

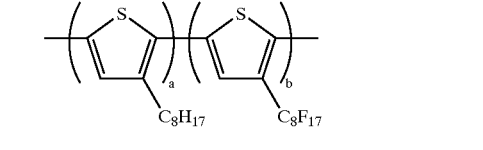

(8)

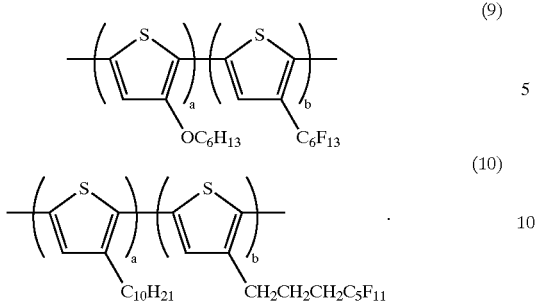

27. An electronic device in accordance with claim 26 wherein a is from about 0.05 to about 1.

28. A thin film transistor in accordance with claim 14 and of the formulas, and wherein a and b represent the mole fractions of each moiety, respectively, and wherein the sum of a+b is equal to about 1

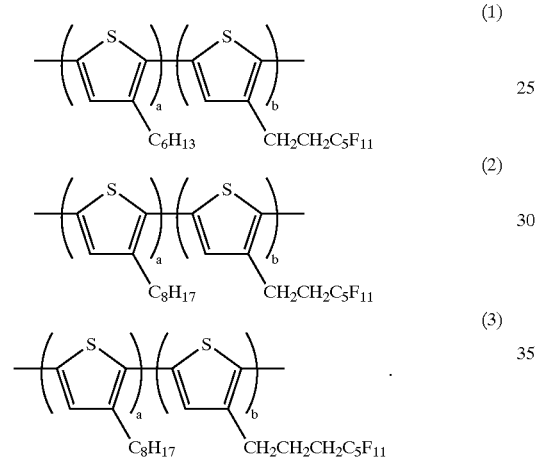

29. A thin film transistor in accordance with claim 14 and of the following formulas, and wherein a and b represent the mole fractions of each moiety, respectively, and wherein the sum of a+b is equal to about 1

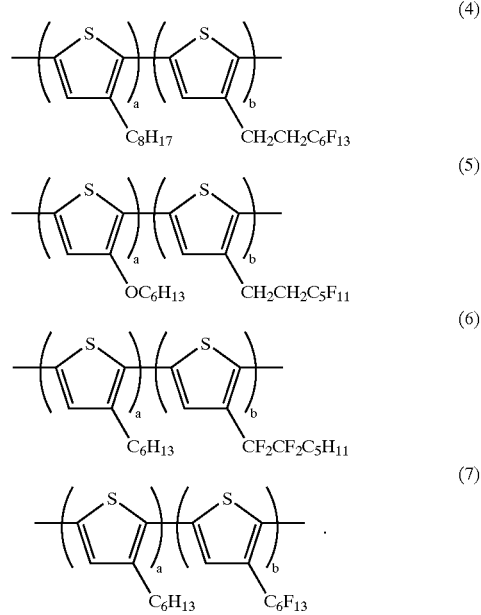

30. An electronic device in accordance with claim 14 wherein a is from about 0.25 to about 0.75.

31. An electronic device comprised of a substrate, a gate electrode, a source electrode, and a polythiophene

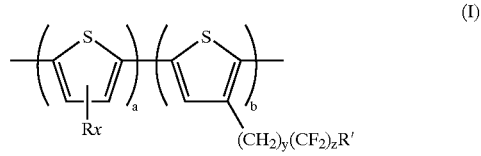

wherein R is an alkyl; x is the number of R groups, R' is $CF_3$; y and z represent the number of segments; and a and b represent the mole fractions of each moiety.

* * * * *

UNITED STATES PATENT AND TRADEMARK OFFICE
CERTIFICATE OF CORRECTION

PATENT NO. : 6,855,951 B2  Page 1 of 1
APPLICATION NO. : 10/392639
DATED : February 15, 2005
INVENTOR(S) : Ong et al.

It is certified that error appears in the above-identified patent and that said Letters Patent is hereby corrected as shown below:

In column 2, the following section should be added before the section title BACKGROUND:

--STATEMENT REGARDING FEDERALLY SPONSORED RESEARCH OR DEVELOPMENT
This invention was made with United States Government support under Cooperative Agreement No. 70NANBOH3033 awarded by the National Institute of Standards and Technology (NIST). The United States Government has certain rights in the invention.--

Signed and Sealed this

Sixth Day of March, 2007

JON W. DUDAS
*Director of the United States Patent and Trademark Office*